United States Patent [19]
Shinozaki

[11] Patent Number: 5,982,163
[45] Date of Patent: *Nov. 9, 1999

[54] INTERNAL POWER SOURCE VOLTAGE TRIMMING CIRCUIT

[75] Inventor: Naoharu Shinozaki, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/967,108

[22] Filed: Nov. 10, 1997

[30] Foreign Application Priority Data

Apr. 11, 1997 [JP] Japan .................................. 9-093987

[51] Int. Cl.[6] .................................................. G05F 3/08
[52] U.S. Cl. .......................................... 323/354; 323/350
[58] Field of Search .................................. 323/313, 314, 323/350, 354

[56] References Cited

U.S. PATENT DOCUMENTS

| | | | |
|---|---|---|---|
| 3,930,304 | 1/1976 | Keller et al. | 323/354 |
| 4,016,483 | 4/1977 | Rudin | 323/354 |
| 4,100,437 | 7/1978 | Hoff | 323/314 |
| 4,201,970 | 5/1980 | Onyshkevych | 323/354 |
| 4,412,241 | 10/1983 | Nelson | 323/354 |
| 4,608,530 | 8/1986 | Bacrania | 323/351 |
| 4,689,550 | 8/1987 | Ujihara et al. | 323/354 |
| 4,766,366 | 8/1988 | Davis | 323/354 |
| 4,799,043 | 1/1989 | Ueda | 323/354 |
| 5,434,498 | 7/1995 | Cordoba et al. | 323/313 |

*Primary Examiner*—Jeffrey Sterrett
*Attorney, Agent, or Firm*—Nikaido, Marmelstein, Murray & Oram LLP

[57] ABSTRACT

A semiconductor device, equipped with a circuit for regulating an internal power source by using a plurality of fuses, includes a fuse group for trimming a power source, having a plurality of fuses capable of being cut off so as to regulate a voltage level of an internal power source; a decoding unit for fuse information of the internal power source, for decoding fuse information in response to a cut-off state of each of these fuses and outputting bit information corresponding to the thus regulated voltage level of the internal power source; and a voltage level regulating unit for a spare fuse pattern, for generating at least one spare pattern other than patters of the bit information used at present and for regulating the voltage level of the internal power source. The voltage level of the internal power source is regulated so that the spare pattern corresponds to any one of the patterns of the bit information used at present.

13 Claims, 10 Drawing Sheets

| FUSE-CUT SIDE | | | OUTPUT OF FUSE CIRCUIT FOR TRIMMING INTERNAL POWER SOURCE | | | SELECTED TRANSFER GATE |
|---|---|---|---|---|---|---|
| 0x | 1x | 2x | rff0x | rff1x | rff2x | |
| L | L | L | L | L | L | 0a |
| H | L | L | L | L | H | 1a |
| L | H | L | L | H | L | 2a |
| H | H | L | L | H | H | 3a |
| L | L | H | H | L | L | 4a |
| H | L | H | H | L | H | NONE |
| L | H | H | H | H | L | NONE |
| H | H | H | H | H | H | NONE |

| FUSE-CUT SIDE | | | OUTPUT OF FUSE CIRCUIT FOR TRIMMING INTERNAL POWER SOURCE | | | SELECTED TRANSFER GATE |
|---|---|---|---|---|---|---|
| 0x | 1x | 2x | rff0x | rff1x | rff2x | |
| L | L | L | L | L | L | 2a |
| H | L | L | L | L | H | 3a |
| L | H | L | L | H | L | 2a |
| H | H | L | L | H | H | 1a |
| L | L | H | H | L | L | 2a |
| H | L | H | H | L | H | 4a |
| L | H | H | H | H | L | 2a |
| H | H | H | H | H | H | 0a |

INTERNAL POWER SOURCE VOLTAGE TRIMMING CIRCUIT

BACKGROUND OF THE INVENTION

1. Field of the Invention

The present invention relates to a semiconductor device equipped with a circuit for regulating a voltage level of an internal power source by using a plurality of fuses after a fabrication of a semiconductor chip.

More specifically, in a semiconductor device capable of trimming a voltage level of an internal power source supplied to sources or drains of MOS (Metal-Oxide Semiconductor) transistors by a fuse circuit having a plurality of fuses, so as to reduce a fluctuation of this voltage level to minimum (that is, semiconductor device capable of compensating for a fluctuation component in the above voltage level that is brought about owing to the level fluctuation of the above voltage level), the present invention relates to a circuit technology which can attain a stable circuit operation, without bringing about an abnormal operation inside the semiconductor chip even when the problems associated with a glow-back or an incomplete cut-off state (i.e., insufficient cut-off state) of each of some fuses, occur.

2. Description of the Related Art

In a semiconductor device having a semiconductor chip, in general, the requirement for lowering a voltage level of a power source supplied to MOS transistors, etc., as much as possible has become stronger, in order to reduce power consumption due to the current flowing through a plurality of MOS transistors fabricated inside the semiconductor chip and to improve the endurance against the voltage applied to each of the oxide films formed in these MOS transistors.

As the voltage level of the power source supplied to the MOS transistors, etc., inside the chip is lowered so as to satisfy the requirement described above, influences due to the fluctuation of the voltage level of an external power source become greater. Therefore, it is customary to lower an external power source (VCC) to a constant voltage level inside the chip and to use this step-down voltage as the voltage level of an internal power source (VII), in order to keep flat (i.e., keep constant) the voltage level of the internal power source, by using an internal power source which is not affected by the fluctuation of the voltage level of the external power source.

Figure 1:
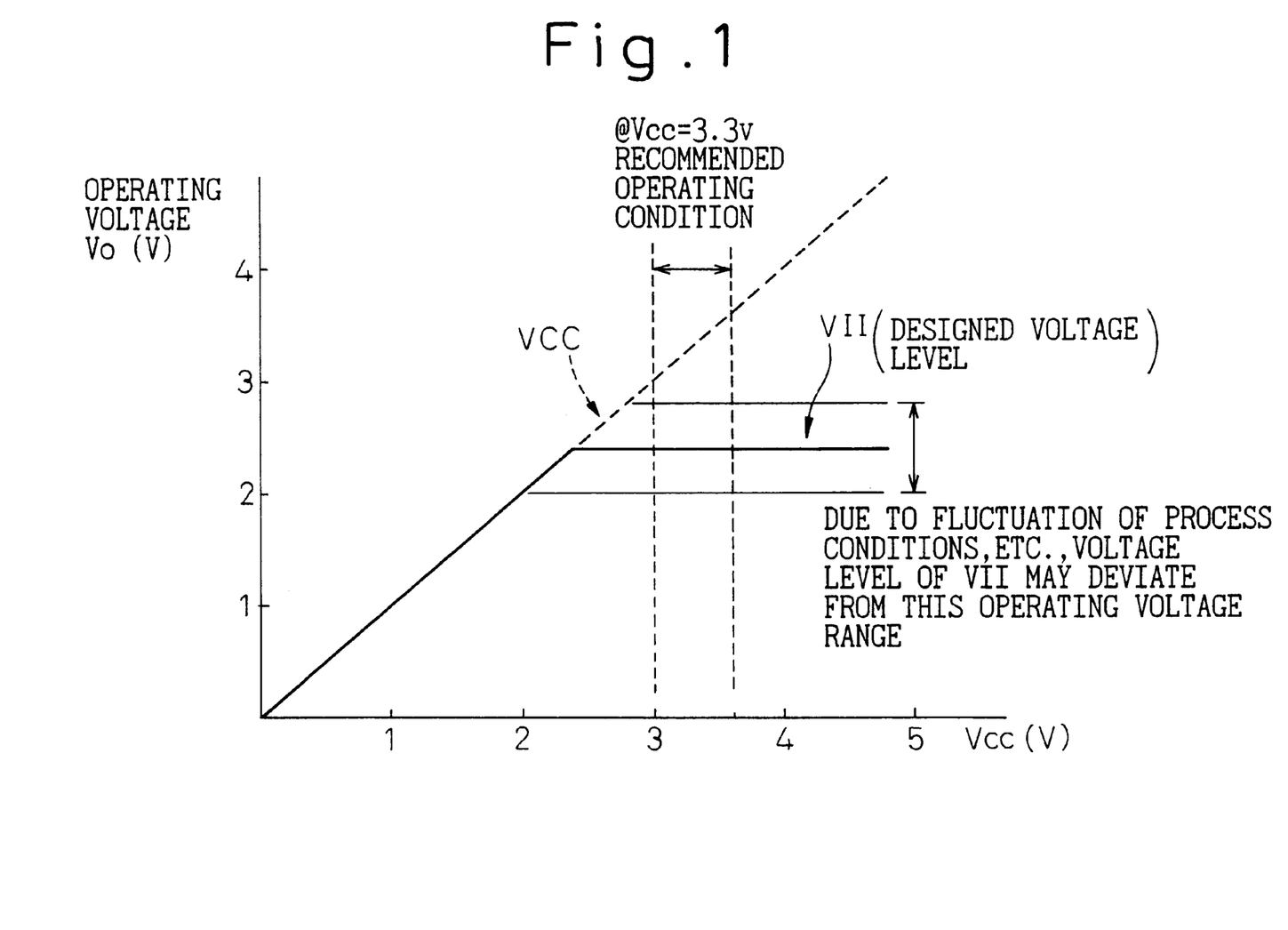
FIG. 1 is a graph showing operations of an external power source and an internal power source.

FIG. 1 is a graph showing operations of the external power source (VCC) and the internal power source (VII). Here, an explanation will be given for the case in which the operating voltage Vcc of the external power source (VCC) is set to 3.3 V as a typical example.

According to specifications placed in catalogues of products of semiconductor devices in which the operating voltage Vcc=3.3 V is stipulated as the external power source (VCC), a recommended operating condition (i.e. recommended operating range) of each of these products of semiconductor devices is Vcc=3.0 V to 3.6 V. However, an internal power source (VII) which is controlled so as to become flat (i.e., remain constant) at the operating voltage Vo of 2.4 V (here, the value of 2.4 V is a design target value or "default value", and an operating voltage range of the internal power source (VII) ranging from 2.0 V to 2.8 V, for example, is permitted) is used in practice so as to flatten the voltage level as described above. It should be noted, however, that there is the case in which an arbitrary voltage level of the internal power source within the operating voltage range described above cannot be obtained after fabrication of the chip, owing to the fluctuation of process conditions during the fabrication of the chip, or the like. In such a case, the voltage level of the internal power source must be regulated by a fuse circuit having a plurality of fuses as will be described later.

Figure 2:
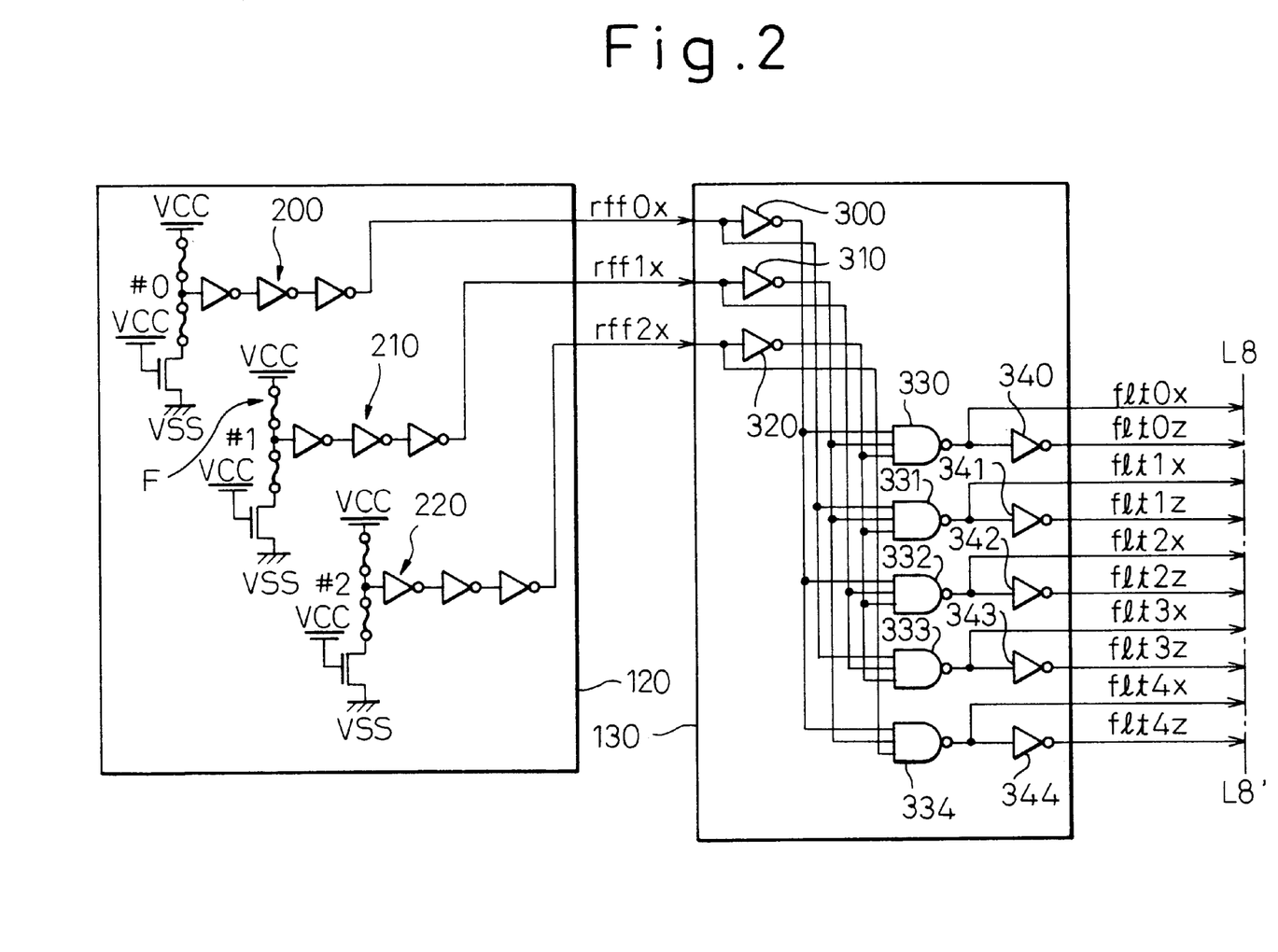
FIG. 2 is the first part of a circuit block diagram showing the mode of regulation of a voltage level of an internal power source of a semiconductor device according to the prior art.
Figure 3:
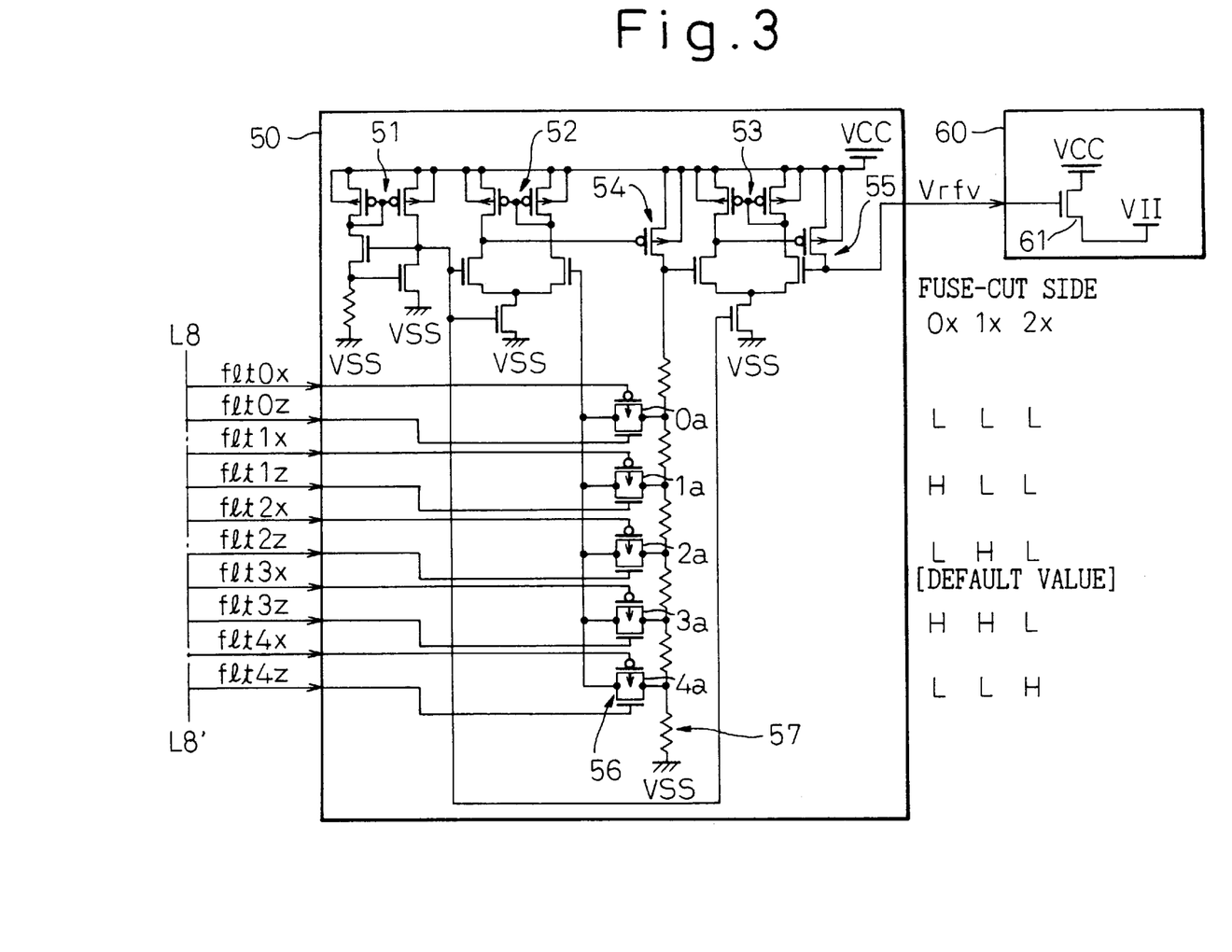
FIG. 3 is the second part of a circuit block diagram showing the mode of regulation of a voltage level of an internal power source of a semiconductor device according to the prior art.

FIGS. 2 and 3 are the first part and the second part of a circuit block diagram showing the mode of the regulation of the internal power source voltage level in a semiconductor device according to the prior art, respectively. In this case, the construction of the semiconductor device is shown in a simplified form.

In the semiconductor device according to the prior art shown in FIG. 2, there are disposed a fuse circuit 120 for trimming an internal power source which is equipped with a plurality of fuses F each being capable of taking a cut-off state as a circuit having the function of regulating a voltage level of an internal power source; and a decoding circuit 130 for fuse information of an internal power source, which decodes fuse information (i.e., output signals rff0x, rff1x and rff2x of the fuse circuit for trimming the internal power source) relating to the cut-off state of the fuses F obtained from the fuse circuit 120, and which converts the above fuse information to bit information associated with the voltage level of the internal power source (decode signals f1t0x to f1t4x and f1t0z to f1t4z).

In the semiconductor device according to the prior art shown in FIG. 3, further, there are disposed an internal power source control circuit 50 which outputs a gate control voltage Vrfv for generating a voltage level of a design target value in accordance with the bit information outputted from the decoding circuit 130 for fuse information of the internal power source; and an internal power source generating circuit 60 which lowers the external power source VCC in accordance with the gate control voltage Vrfv outputted from the internal power source control circuit 50 and which converts the external power source to the internal power source VII (i.e., a step-down internal power source).

In the circuit construction described above, the final voltage level of the step-down internal power source VII is decided by the fuse circuit 120 for trimming the internal power source, the decoding circuit 130 for fuse information of the internal power source, the internal power source control circuit 50 and the internal power source generating circuit 60.

In the example of the circuit for regulating the voltage level of the internal power source described above, a transistor 61 for stepping down the external power source inside the internal power source generating circuit 60 includes an N channel type transistor, but the transistor 61 is not particularly limited to this N channel type transistor. The method of stepping down and controlling the power source converts the external power source VCC to the internal power source VII by regulating the potential of the gate of the transistor 61 for stepping down the external power source. In other words, one of the junctions (nodes) of a plurality of level regulating resistors 57 is selected by operating any one of a plurality of transfer gates 0a to 4a inside the transfer gate circuit unit 56 in the internal power source control circuit 50 shown in FIG. 3, and it is possible to carry out the conversion operation from the external power source VCC to the internal power source VII by regulating the voltage level of the output node (gate control voltage (Vrfv)). Each of a plurality of transfer gates described above includes a CMOS transistor having a P channel type transistor and an N channel type transistor. The arrow attached to the P channel type transistor represents back-bias applied to the gate of the P channel type transistor. Incidentally, the circuit construction of the internal power source control circuit 50 shown in FIG. 3 will be described in further detail in the paragraph "DESCRIPTION OF THE PREFERRED EMBODIMENTS".

The voltage level of the gate control voltage Vrfv is originally determined by the internal power source control circuit 50 shown in FIG. 3. However, if semiconductor devices are fabricated and manufactured into products under an undesirable condition such as a fluctuation of process conditions during the fabrication of the chip, the internal power source VII having a design target voltage level, that is, the gate control voltage Vrfv having a necessary voltage level, cannot be outputted in most cases, as shown in FIG. 1.

The prior art example shown in FIGS. 2 and 3 is equipped with the fuse circuit 120 for trimming the internal power source and the decoding circuit 130 for fuse information of the internal power source 130 in order to accurately regulate the voltage level of the internal power source VII after the process for fabricating the chip is completed.

The prior art example described above is of the type which can regulate the voltage level of the gate control voltage Vrfv to the design target voltage level by regulating the resistance value of the level regulating resistors 57 inside the internal power source control circuit 50. Fuse information relating to the cut-off state of each of a plurality of fuses (for examples, three pairs of fuses) inside the fuse circuit 120 for trimming the internal power source shown in FIG. 2, are inputted in the form of the output signals rff0x to rff2x of the three fuse circuits for trimming the internal power source to three inverters 300 to 320 for decoding the fuse information inside the decoding circuit 130 for fuse information of the internal power source, through level converting circuit units 200 to 220, respectively. NAND gates 330 to 334 for generating the fuse information patterns, inside this decoding circuit 130 for fuse information of the internal power source, decode the fuse information on the basis of the input signals (non-inversion signals) and the output signals (inversion signals) of the inverters 300 to 320 for decoding the fuse information. Further binary bit information associated with the voltage levels of the internal power source (decode signals f1t0x to f1t4x and f1t0z to f1t4z) is outputted through the inverters 340 to 344 for generating the fuse information patterns. In other words, any one of a plurality of transfer gates 0a to 4a of the internal power source control circuit 50 shown in FIG. 3 is operated on the basis of the decoding result of the fuse information described above so as to regulate the resistance value of the level regulating resistor 57 and to thus generate the gate control voltage Vrfv of an arbitrary level. By the way, the fuse circuit 120 for trimming the internal power source and the decoding circuit 130 for the fuse information of the internal power source are hereby constituted by the inverters and the NAND gates, but they should not be limited to the inverters and the NAND gates.

In the prior art example described above, the level regulating resistors 57 inside the internal power source control circuit 50 are selected in accordance with five bit information patterns shown at the right part of FIG. 3 so as to trim the voltage level of the internal power source. The design target value (i.e. default value) of the voltage level of the internal power source is the center value of the operating voltage range, and the case in which the output levels of the decode signals f1t2x and f1t2z are "L" (Low) and "HI" (High), respectively, and the transfer gate 2a is selected, corresponds to the case in which the voltage level of the internal power source is regulated so as to attain the design target value described above.

The power source voltage levels that can be set to levels higher and lower than the design target value by two points, respectively, define the voltage range which can be trimmed by the selection of the level regulating resistors 57. When the operating voltage Vo of the internal power source VII becomes higher or lower than the operating voltage range due to a fluctuation of process conditions during the fabrication of the chip or the like, as shown in FIG. 1, the operating voltage can be regulated in the range of the voltage level covered by the above two points in both the upward and downward directions of the operating voltage level.

Figure 4:
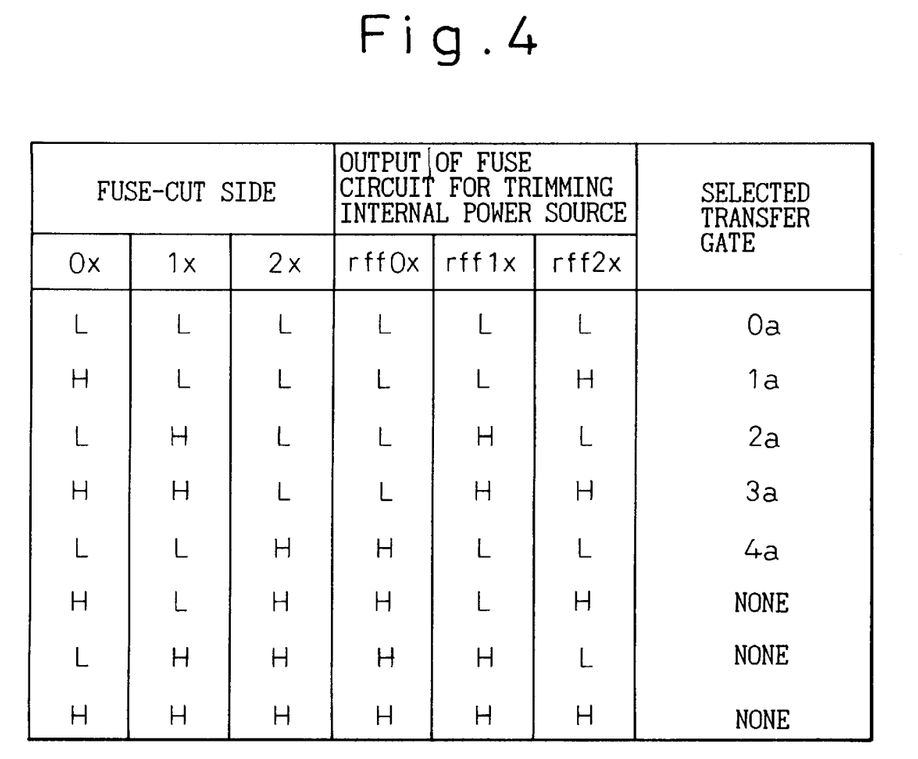
FIG. 4 is a diagram showing the relationship between a fuse selection and an output level in the prior art construction.

In order to illustrate the transfer gate which is selected by the internal power source control circuit 50, when the upper fuse or the lower fuse in each pair of fuses inside the fuse circuit 120 for trimming the internal power source are selectively cut off, FIG. 4 shows the relationship between a fuse selection and an output level in the prior art construction.

To select the five bit information described above, it is necessary to prepare a plurality of fuses corresponding to the number of fuses that is necessary for representing at least bit information of at least three bits ($2^3=8$). The fuse circuit 120 for trimming the internal power source described above can represent 3-bit (three-bit) information by using three pairs of fuses. When either one of the upper fuse and the lower fuse in each pair of fuses connected to the power source for the drain (here, the external power source VCC) and the power source for the source (here, the power source with the ground level VSS) is cut off, the decoding circuit 130 for fuse information of the internal power source is allowed to distinguish between "0" and "1", respectively.

In the fuse circuit 120 for trimming the internal power source, when the upper fuse is cut off, the node #k (here, k=0 to 2) is set to the voltage level of the power source for the source (approximately 0V) and the potential of this node #k is converted to a high logic level by the level converting circuit units 200 to 220. Therefore, the level of the output signal rff#k of the fuse circuit for trimming the internal power source changes to the level "H" (here, #=0 to 2; rff#x="H"). When the lower fuse is cut off, the node #k (here, k=0 to 2) is set to the voltage level of the power source for the drain (approximately Vcc), and the potential of this node #k is converted to a low logic level by the level converting circuit units 200 to 220. Therefore, the level of the output signal rff#x of the fuse circuit for trimming the internal power source changes to the level "L" (rff#x="L"). Furthermore, when the output signals rff0x to rff2x of the fuse circuit for trimming the internal power source sent from all the nodes #0 to #2 are decoded by the decoding circuit 130 for fuse information of the internal power source, the resistance values of the level regulating resistors 57 used in the internal power source control circuit 50, are decided.

Symbols 0x, 1x and 2x in FIG. 4 (or FIG. 3) represent #x of the output signals rff#x of the fuse circuit for trimming the internal power source, and also represent fuse information relating to the cut-off state of each of the fuses at all the nodes #0 to #2 on the fuse-cut side. In other words, these 0x, 1x and 2x represent the level of three inputs of a plurality of NAND gates for generating fuse information patterns for operating any one of the transfer gates 0a to 4a of the internal power source control circuit 50 shown in FIG. 3.

When the first transfer gate 0a disposed in the uppermost portion of these transfer gates 0a to 4a inside the internal power source control circuit 50 (FIG. 3) is desired to be selectively turned ON (i.e., to the operating state), for example, as shown in FIG. 4, the fuse for 0x in the NAND gate 330 for generating the fuse information, which is connected to this transfer gate 0a, is cut off so as to select the level "L", the fuse for 1x is also cut off so as to select the level "L", and the fuse for 2x, too, is cut off so as to select the level "L".

On the other hand, when the fifth transfer gate 4a of the lowermost portion of the transfer gates 0a to 4a inside the internal power source control circuit 50 is desired to be selectively turned ON, the fuse for 0x in the NAND gate 334 for generating the fuse information pattern, which is connected to this transfer gate 4a, is cut off so as to select the level "L", the fuse for 1x is also cut off so as to select the level "L" and only the fuse for 2x is cut off so as to select the level "H".

However, in the circuit having the function of regulating the voltage level of the internal power source according to the prior art described above, the fuse circuit such as the fuse circuit for trimming the internal power source is used in order to regulate this voltage level after the process for fabricating the chip is completed. Accordingly, this circuit involves the following problem.

A phenomenon referred to as a "glow-back" sometimes occurs in this circuit. The term "glow-back" hereby represents the phenomenon in which the fuse which should have been cut off by using a laser, etc., is not sufficiently cut off and remains in an incomplete cut-off state, or the phenomenon in which the fuse returns to the state before the cut-off state due to a stress caused by heat or voltage. Speaking electrically, this phenomenon means the case in which a resistance value of the portion which should attain a high resistance value after a cut-off of a given fuse changes to a low resistance value due to the glow-back (when the cut-off of the fuse is carried out insufficiently, the fuse remains in a low resistance value from the beginning).

When the voltage level of the internal power source has the design target value (i.e. default value) in the case of the fuse circuit for trimming the internal power source shown in FIG. 2, the fuse for 0x is cut off so as to select the level "L", the fuse for 1x is cut off so as to select the level "H" and the fuse for 2x is selected so as to select the level "L". In other words, the fuses at the nodes #0 to #2 inside the fuse circuit for trimming the internal power source may be cut off so as to select the level "L", "H" and "L", respectively. When such a process for cutting off fuses is carried out, the circuit operation is executed so that the third transfer gate 2a disposed in the central portion of the transfer gates 0a to 4a, for regulating the resistance value of the level regulating resistors 57 inside the internal power source control circuit 50, is selected.

On the other hand, the phenomenon brought about when a glow-back has occurred in the fuse circuit for trimming the internal power source will be considered.

The construction of this fuse circuit for trimming the internal power source is set so that the output signal rff#x of the fuse circuit for trimming the internal power source outputs the level "L" before the fuses are cut off. Therefore, the resistance value of the level regulating resistor 57 inside the internal power source control circuit 50, which is selected immediately after the completion of the process for fabricating the chip, is decided by the node connected to the first transfer gate 0a disposed in the uppermost portion of the transfer gates 0a to 4a.

Further, the fuses are cut off so as to attain an arbitrary value after the voltage level of the internal power source VII is measured. However, when all the fuses that are cut off undergo a glow-back, the node connected to the first transfer gate 0a is selected. In this case, a potential corresponding to a certain voltage level is supplied to this node through the transfer gate 0a and no critical problem occurs.

However, when only a certain fuse or only a portion of this fuse is in an incomplete cut-off state, and the pattern of bit information constituted by this incomplete cut-off state is a pattern other than the patterns of the five bit information described above, that is, when a given unnecessary pattern which is shown at the lower part of FIG. 4 and is not used at present is selected, all the transfer gates change to the OFF state (i.e., the non-operating state) and the overall circuitry inclusive of the fuse circuit 120 for trimming the internal power source, the decoding circuit 130 for fuse information of the internal power source and the internal power source control circuit 50 becomes unstable. In consequence, the problem occurs in that the semiconductor chip in which this circuit is formed carries out an abnormal operation.

SUMMARY OF THE INVENTION

In view of the problem described above, an object of the present invention is to provide a semiconductor device which can avoid an abnormal operation inside a semiconductor chip and can ensure a stable operation even when a glow-back occurs after fuses inside a fuse circuit for regulating a voltage level of an internal power source are cut off or when the cut-off state of the fuses is incomplete.

A semiconductor device according to the present invention for accomplishing the objects described above includes an internal power source trimming unit for regulating a voltage level of an internal power source. The internal power source trimming unit includes a fuse group for trimming a power source, having a plurality of fuses capable of being cut off so as to regulate the voltage level of the internal power source; a decoding unit for fuse information, for decoding fuse information in response to a cut-off state of each of these fuses in the fuse group for trimming the power source, and for outputting bit information corresponding to the thus regulated voltage level of the internal power source; and a voltage level regulating unit for a spare fuse pattern, for generating at least one spare pattern other than patterns of bit information used at present and for regulating the voltage level of the internal power source, when the number of patterns of the bit information, outputted from the decoding unit for fuse information and used for regulating a fluctuation of the voltage level of the internal power source, is smaller than the maximum number of patterns of the fuse information that can be generated by these fuses. Here, the spare pattern is arranged so as to correspond to any one of the patterns of the bit information used at present and to regulate the voltage level of the internal power source.

Preferably, in the semiconductor device described above, the voltage level of the internal power source selected by the decoding unit for fuse information of the internal power source is set to substantially the center of a range of voltage levels that can be regulated by the patterns of the bit information used at present, before a plurality of the fuses are cut off.

Further, preferably, in the semiconductor device described above, the voltage level of the internal power source selected by the spare pattern is set to substantially the center of a range of voltage levels that can be regulated by the patterns of the bit information used at present.

Further, preferably, in the semiconductor device described above, the voltage level of the internal power source selected by the spare pattern is set to be substantially equal to the voltage level of the internal power source selected before a plurality of the fuses are cut off.

Further, preferably, the semiconductor device according to the present invention includes an internal power source trimming unit for regulating a voltage level of an internal power source, wherein the internal power source trimming unit includes a fuse group for trimming a power source, having a plurality of fuses capable of being cut off so as to regulate the voltage level of the internal power source; a decoding unit for fuse information of the internal power source, for decoding fuse information in response to a cut-off state of each of these fuses in the fuse group for trimming the power source, and for outputting bit information corresponding to the thus regulated voltage level of the internal power source; and a voltage level regulating unit for a spare pattern, for receiving the fuse information and outputting bit information corresponding to one of the patterns of the bit information, when the number of the patterns of the bit information is smaller than the maximum number of patterns of the fuse information that can be generated by these fuses and when the fuse information outputted from the fuse group for trimming the internal power source does not coincide with any one of the patterns of the bit information.

Further, preferably, the semiconductor device according to the present invention having an internal power source generating portion for outputting an internal power source in response to a reference voltage, includes n fuses (n is an arbitrary positive integer) each capable of being cut off for outputting a selection signal which is n bits; a reference voltage generating portion for outputting the reference voltage which is selected among m option voltages (m is an arbitrary positive integer) in response to a decode signal, m being smaller than $2^n$; and a decoding unit for decoding the selection signal for outputting the decode signal. Here, each of $2^n$ information of the selection signal corresponds to one of the above m option voltages.

According to the semiconductor device of the present invention, even when a glow-back occurs after at least a part of a plurality of fuses in the fuse circuit in the fuse group for trimming the power source and when the pattern of the spare bit information, which is not used at present, is selected, an improvement is made in a system for decoding the fuse information and a feedback control is carried out in the voltage level regulating unit for a spare fuse pattern so that any one of transfer gates inside an internal power source control unit, etc., connected to the internal power source trimming unit is turned ON without fail. Therefore, a stable operating state of the overall circuit can be secured, and it becomes possible to avoid an abnormal operation of the semiconductor chip.

Further, according to the semiconductor device of the present invention, the voltage level of the internal power source selected by at least one spare pattern is regulated so as to correspond to any one of the patterns of the bit information used at present. Therefore, even when a glow-back occurs after the cut-off of the fuses, the voltage level of the internal power source does not greatly deviate from the design target value, and a stable operating state of the overall circuit can be secured.

BRIEF DESCRIPTION OF THE DRAWINGS

The above objects and features of the present invention will be more apparent from the following description of some preferred embodiments with reference to the accompanying drawings, wherein.

DESCRIPTION OF THE PREFERRED EMBODIMENTS

Hereinafter, some preferred embodiments of the present invention will be explained with reference to the accompanying drawings (FIGS. 5 to 10).

Figure 5:
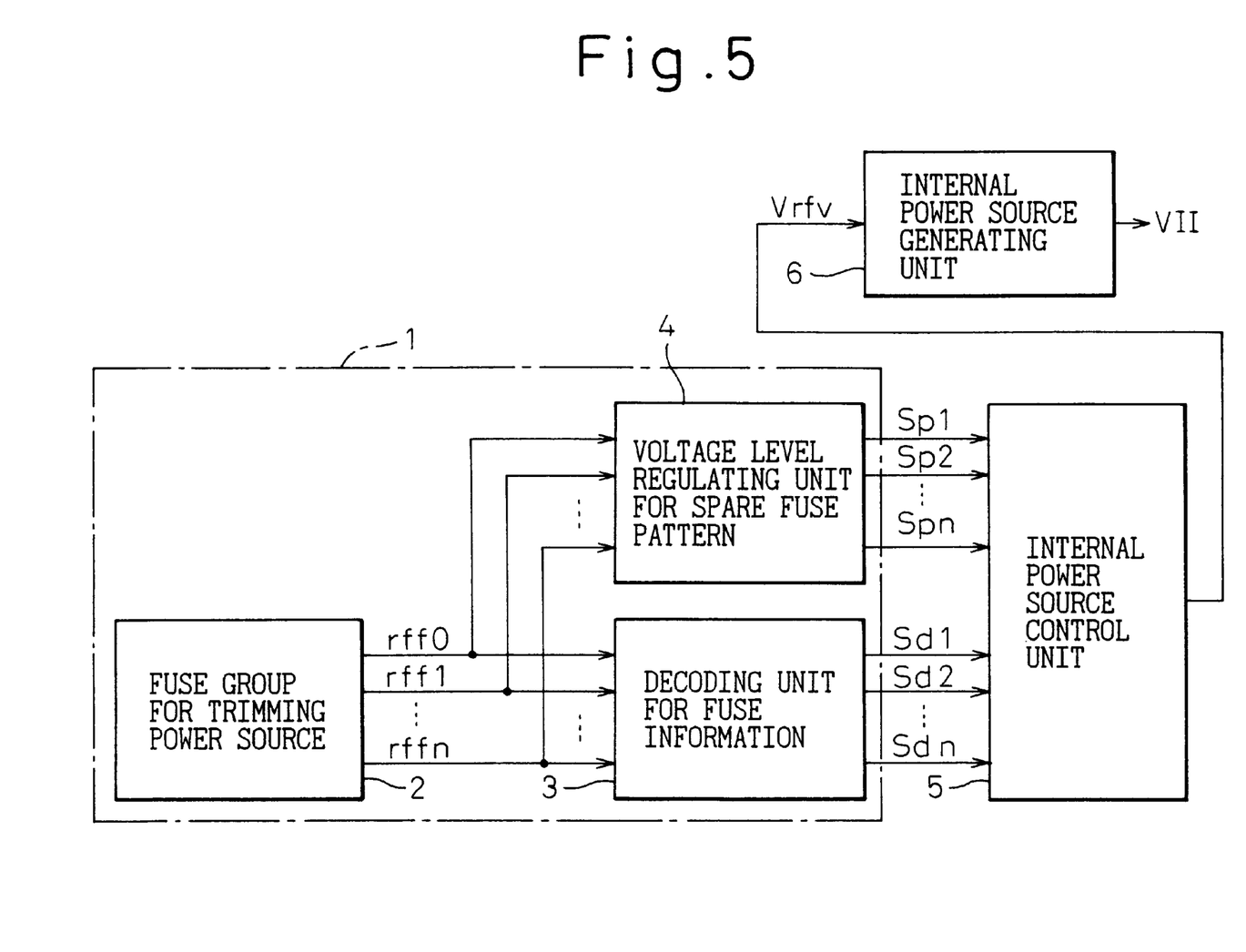
FIG. 5 is a block diagram showing a basic embodiment based on the principle of the present invention.

FIG. 5 is a block diagram showing a basic embodiment based on the principle of the present invention. Hereinafter, like reference numerals will be used to identify the same constituent elements as already described.

The embodiment of the semiconductor device according to the present invention shown in FIG. 5 includes an internal power source trimming unit 1 for regulating a voltage level of an internal power source. This internal power source trimming unit 1 includes a fuse group 2 for trimming a power source such as an internal power source, having a plurality of fuses that can be cut off so as to regulate the voltage level of the internal power source; a decoding unit 3 for fuse information of the internal power source, for decoding fuse information in response to a cut-off state of each of a plurality of fuses in the fuse group 2 for trimming the power source (that is, fuse information signals rff0 to rffn for trimming the internal power source), and outputting bit information corresponding to the voltage level of the internal power source regulated as described above; and a voltage level regulating unit 4 for a spare fuse pattern, which generates one or more than one spare patterns other than patterns of the bit information used at present (that is, unnecessary patterns), when the number of the patterns of the bit information used at present for regulating the voltage level of the internal power source (that is, fuse information decode signals Sd1 to Sdn) is smaller than the maximum number of patterns of the fuse information that can be generated by these fuses, and which regulates the voltage level of the internal power source. In this case, the fuse group 2 may be defined as n fuses each of which is capable of being cut off for outputting a selection signal which is n bits (n is an arbitrary integer).

These spare patterns are arranged to output spare pattern voltage level regulating signals Sp1 to Spn, so as to correspond to any of the patterns of the bit information used at present and to regulate the voltage level of the internal power source.

In FIG. 5, further, there are disposed an internal power source control unit 5 for generating a voltage level of a design target value (i.e. default value), in accordance with the fuse information decoded signals Sd1 to Sdn generated by the decoding unit 3 for fuse information and in accordance with the spare pattern voltage level regulating signals Sp1 to Spn generated by the voltage level regulating unit 4 for a spare fuse pattern; and an internal power source generating unit 6 for lowering an external power source VCC in accordance with a gate control voltage Vrfv outputted from this internal power source control unit 5 and converting the same to the internal power source VII. In this case, the internal power source control unit 5 may be referred to as a reference voltage generating portion which outputs a reference voltage corresponding to the gate control voltage Vrfv that is selected among m option voltages (m is an arbitrary integer, and m is smaller than $2^n$). Further, the internal power source generating unit 6 may be referred to as an internal power source generating portion which outputs an internal power source VII in response to the above reference voltage.

Typically, the internal power source control unit 5 and the internal power source generating unit 6 may be constituted by a conventional internal power source control unit 50 (see FIG. 3) and a conventional internal power source generating circuit 60 (see FIG. 3) in the prior art, respectively. In this case, they do not constitute the constituent elements of the present invention.

Preferably, in the basic embodiment of the semiconductor device of the present invention shown in FIG. 5, the voltage level of the internal power source selected by the decoding unit 3 for fuse information is set to substantially the center of a range of voltage levels that can be regulated by the patterns of the bit information used at present, in the case in which a plurality of the fuses have not yet been cut off.

Further, preferably, in the basic embodiment of the semiconductor device of the present invention shown in FIG. 5, the voltage level of the internal power source selected by the spare patterns is set to substantially the center of a range voltage levels that can be regulated by the patterns of the bit information used at present.

Further, preferably, in the basic embodiment of the semiconductor device of the present invention shown in FIG. 5, the voltage level of the internal power source selected by the spare pattern is set to be substantially equal to the voltage level of the internal power source selected before a plurality of the fuses are cut off.

On the other hand, the basic embodiment of the semiconductor device of the present invention shown in FIG. 5 includes the internal power source trimming unit 1 for regulating the voltage level of the internal power source, and this internal power source trimming unit 1 includes the fuse group 2 for trimming the power source, having a plurality of fuses that can be cut off so as to regulate the voltage level of the internal power source; the decoding unit 3 for fuse information, for decoding the fuse information in response to a cut-off state of each of these fuses in the fuse group 2 for trimming the power source, and for outputting bit information corresponding to the thus regulated voltage level of the internal power source; and the voltage level regulating unit 4 for a spare fuse pattern, which receives the fuse information and outputs the bit information corresponding to one of patterns of bit information, when the number of patterns of the bit information is smaller than the maximum number of patterns of the fuse information that can be generated by a plurality of fuses and when the fuse information outputted from the power source trimming fuse group 2 for trimming the internal power source does not coincide with any one of the patterns of the bit information.

According to the basic embodiment of the semiconductor device of the present invention shown in FIG. 5, a novel contrivance is made in a system for decoding the fuse information even when a glow-back occurs after at least a part of a plurality of fuses inside the fuse circuit in the fuse group 2 for trimming the power source is cut off and the pattern of the spare bit information not used at present is selected, and a feedback control is carried out in the voltage level regulating unit 4 for a spare fuse pattern so that any one of the transfer gates inside the internal power source control unit 5 is turned ON without fail. In consequence, a stable operating state of the overall circuitry can be secured and the semiconductor chip can be prevented from carrying out an abnormal operation.

According to the basic embodiment described above, all the voltage levels of the internal power source selected by the spare patterns of the spare bit information are regulated so as to correspond to any one of the voltage levels of the pattern of the bit information used at present (e.g., one of the spare patterns are regulated so that the voltage level is set to substantially the center of a range of voltage levels that can be regulated by the patterns of the bit information used at present. Therefore, even when a glow-back occurs after the cut-off of the fuses, the voltage level of the internal power source does not greatly deviate from the design target value, and the stable operating state of the overall circuit can be secured.

Figure 6:
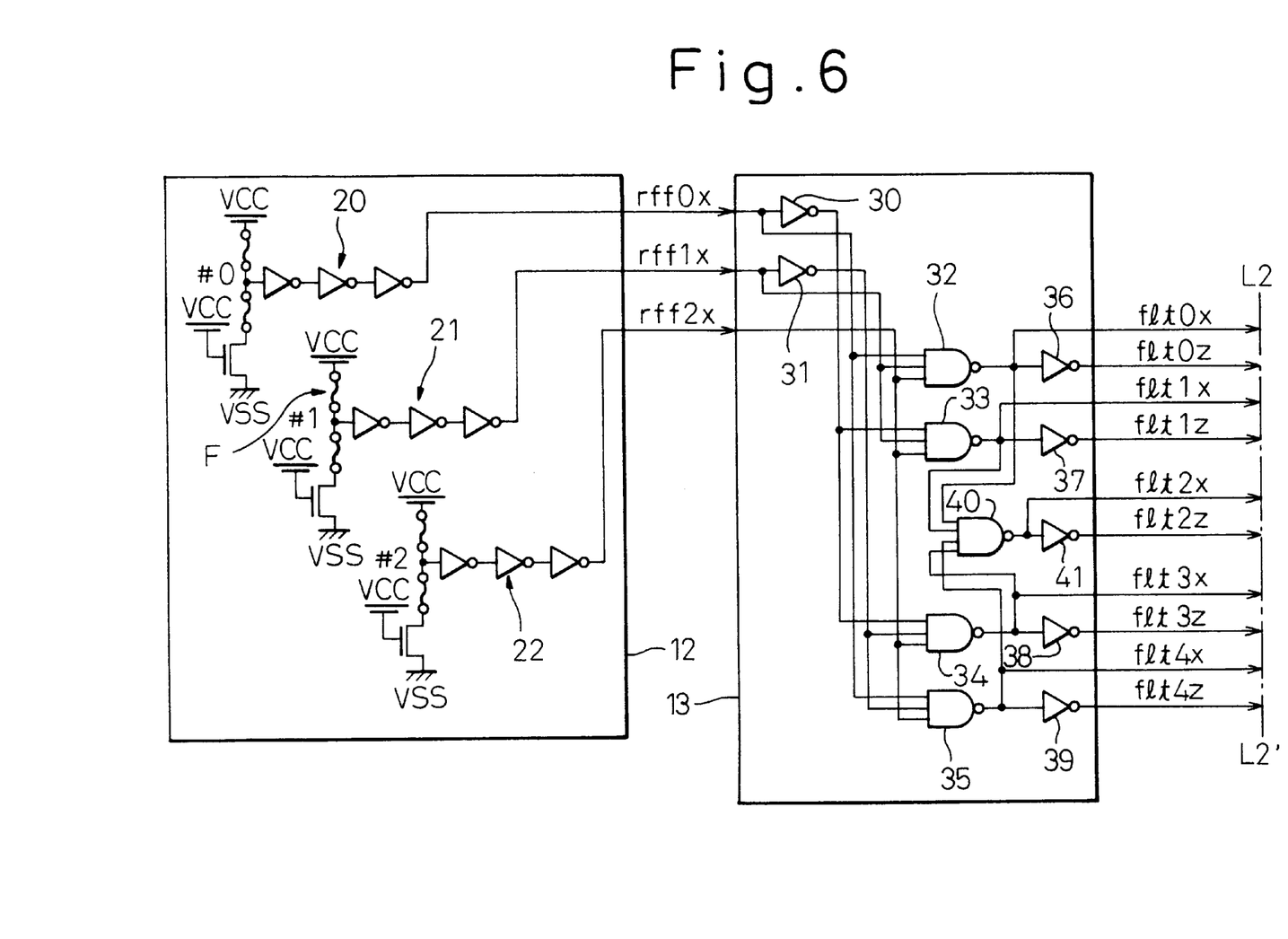
FIG. 6 is the first part of a circuit block diagram showing a preferred embodiment of the present invention.
Figure 7:
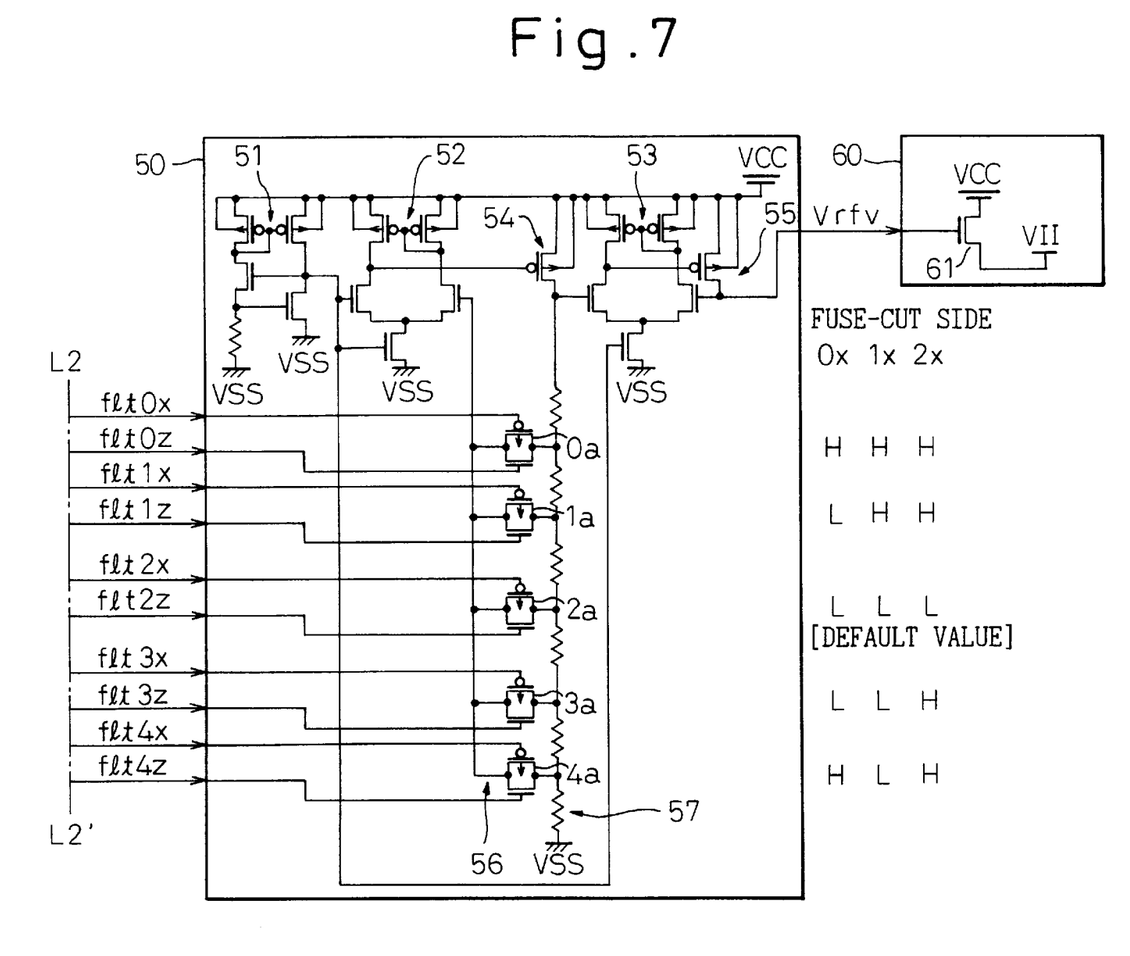
FIG. 7 is the second part of a circuit block diagram showing a preferred embodiment of the present invention.

FIGS. 6 and 7 are the first part and the second part of circuit block diagrams showing a preferred embodiment of the present invention, respectively. Also, in these drawings, the construction of the semiconductor device is shown in the simplified form in the same way as in FIGS. 2 and 3 described above.

In the embodiment shown in FIG. 6, a fuse circuit 12 for trimming an internal power source equipped with a plurality of fuses each of which can be cut off is disposed, as a typical example of the fuse group 2 for trimming the power source (see FIG. 5) having a plurality of fuses capable of being cut off for regulating the voltage level of the internal power source VII (that is, capable of compensating for a fluctuation component in the above voltage level that is brought about owing to the level fluctuation of the above voltage level).

This fuse circuit 12 for trimming the internal power source is equipped with a plurality of level converting circuit portions 20 to 22 for converting the voltage levels at nodes #0 to #2 of a plurality of fuses F to binary output levels and for generating the corresponding fuse circuit output signals rff0x to rff2x for trimming the internal power source.

Here, the fuse circuit 12 for trimming the internal power source is equipped with three pairs of fuses which can express 3-bit information. When either one of the upper fuse and the lower fuse in each pair of fuses connected to the power source for the drain (here, the external power source VCC) and the power source for the source (here, the power source with the ground level VSS) is cut off, the decoding unit 13 for fuse information of the internal power source is allowed to distinguish between "0" and "1", respectively.

In FIG. 6, further, there is disposed a decoding unit 13 for fuse information of the internal power source for decoding the fuse information relating to the cut-off state of each of the fuses on the basis of the three fuse circuit output signals rff0x to rff2x for trimming the internal power source that are outputted from the fuse circuit 12 for trimming the internal power source described above, as the decoding unit 3 for fuse information (see FIG. 5), and for converting the fuse information to patterns of the bit information associated with the voltage level of the internal power source. Furthermore, an unnecessary pattern selecting circuit portion 40, and an unnecessary pattern generating inverter 41 for generating spare patterns other than the patterns of the bit information used at present (that is, unnecessary patterns) and for inputting these spare patterns to the internal power source control unit 50 (see FIG. 7), are disposed inside the decoding unit 13 for fuse information of the internal power source, as the afore-mentioned voltage level regulating unit 4 for a spare fuse pattern.

The explanation will be given in further detail. The decoding unit 13 for fuse information of the internal power source described above includes inverters 30 and 31 for decoding the fuse information which convert the levels of the three fuse circuit output signals rff0x to rff2x for trimming the internal power source; NAND gates 32 to 35 for generating fuse information patterns which generate patterns of a plurality of bit information (i.e., decode signals f1t0x to f1t4x and f1t0z to f1t4z) corresponding to the fuse information, on the basis of the fuse circuit output signals rff0x to rff2x for trimming the internal power source and output signals from these inverters 30 and 31; and four inverters 36 to 39 for generating four fuse information patterns which invert the output signals from the NAND gates 32 to 35 for generating fuse information patterns, respectively, and which supply the thus inverted output signals to the internal power source control circuit 50.

It should be noted hereby that in the preferred embodiment of the present invention shown in FIG. 6, the unnecessary pattern selecting circuit portion 40 and the unnecessary pattern generating inverter 41 are disposed inside the decoding unit 13 for fuse information of the internal power source. The NAND gate that constitutes this unnecessary pattern selecting circuit portion 40 receives the output signals of other NAND gates 32 to 35 for generating fuse information pattern as input signals thereof functioning as feedback signals. In such a configuration, when a certain spare pattern other than the patterns of the bit information used at present is selected, this NAND gate selects any one of transfer gates of a transfer gate circuit portion 56 (FIG. 7) inside the internal power source control circuit 50 (FIG. 7). In this way, even when a glow-back occurs after the cut-off of the fuses and the spare pattern not used at present is selected, the unnecessary pattern selecting circuit portion 40 operates in such a manner as to turn ON any one of the transfer gates without fail. Therefore, a stable operating state of the overall circuitry can be secured and the semiconductor chip is prevented from carrying out an abnormal operation.

Further, the difference between the voltage level established before an occurrence of a glow-back, and the voltage level brought about in the case in which a glow-back occurs after the cut-off of the fuses and the spare pattern other than the patterns of the bit information used at present is selected, will be considered. In the prior art example shown in FIGS. 2 and 3, the resistance value of the level regulating resistor 57 greatly fluctuates so that the transfer gate of the transfer gate circuit portion 56 selected after the cut-off of the fuses is switched from the fifth transfer gate 4a to the first transfer gate 0a at the worst case. On the other hand, in the embodiment shown in FIGS. 6 and 7, the fluctuation of the resistance value becomes half of the fluctuation in the prior art since the transfer gate is switched from the fifth transfer gate 4a to the third transfer gate 2a or from the first transfer gate 0a to the third transfer gate at the worst case. Therefore, this embodiment contributes to a stable circuit operation even after a glow-back.

In the embodiment shown in FIG. 7, further, there are disposed the internal power source control circuit 50 for outputting the gate control voltage Vrfv for generating the voltage level having the default value, in accordance with the bit information outputted from the decoding unit 13 for fuse information of the internal power source; and the internal power source generating circuit 60 for lowering the external power source VCC and converting the same to the internal power source VII, in accordance with the gate control voltage Vrfv from this internal power source control circuit 50, in the same way as in FIG. 3.

In the circuit construction described above, the final step-down voltage level of the internal power source VII is decided by the fuse circuit 12 for trimming the internal power source, the decoding unit 13 for fuse information of the internal power source, the unnecessary pattern selecting circuit portion 40, the internal power source control circuit 50, and the internal power source generating circuit 60.

The method of stepping down and controlling the internal power source by this internal power source generating circuit 60 converts the external power source VCC to the internal power source VII, by regulating the gate potential of the transistor 61 for stepping down the external power source. In other words, any one of a plurality of transfer gates 0a to 4a inside the transfer gate circuit portion 56 in the internal power source control circuit 50 shown in FIG. 7 is operated so as to select one node of a plurality of level regulating resistors 57, and the external power source VCC can thus be converted to the internal power source VII by regulating the voltage level of the gate control voltage Vrfv.

In the internal power source control circuit 50 shown in FIG. 7, further, there are disposed internal power source voltage regulating circuits 51 to 53 which are connected to a transfer gate circuit portion 56 and to level regulating resistors 57, a diode 54 for clamping a control voltage level of the internal power source and a diode 55 for clamping a voltage level. The internal power source voltage regulating circuits 51 to 53 have the function of accurately regulating the voltage level of the internal power source determined by the resistance value of the level regulating resistor 57, which is in turn determined by the decode signals f1t0x to f1t4x and f1t0z to f1t4z from the decoding unit 13 for fuse information of the internal power source. Further, the diode 54 for clamping the control voltage level of the internal power source and the diode 55 for clamping the voltage level have the function of restricting the fluctuation of the voltage level. By the way, all of the internal power source voltage level regulating circuits 51 to 53, the diode 54 for clamping the control voltage of the internal power source and the diode 55 for clamping the voltage level comprise the P channel type transistors but are not particularly limited thereto.

Figure 8:
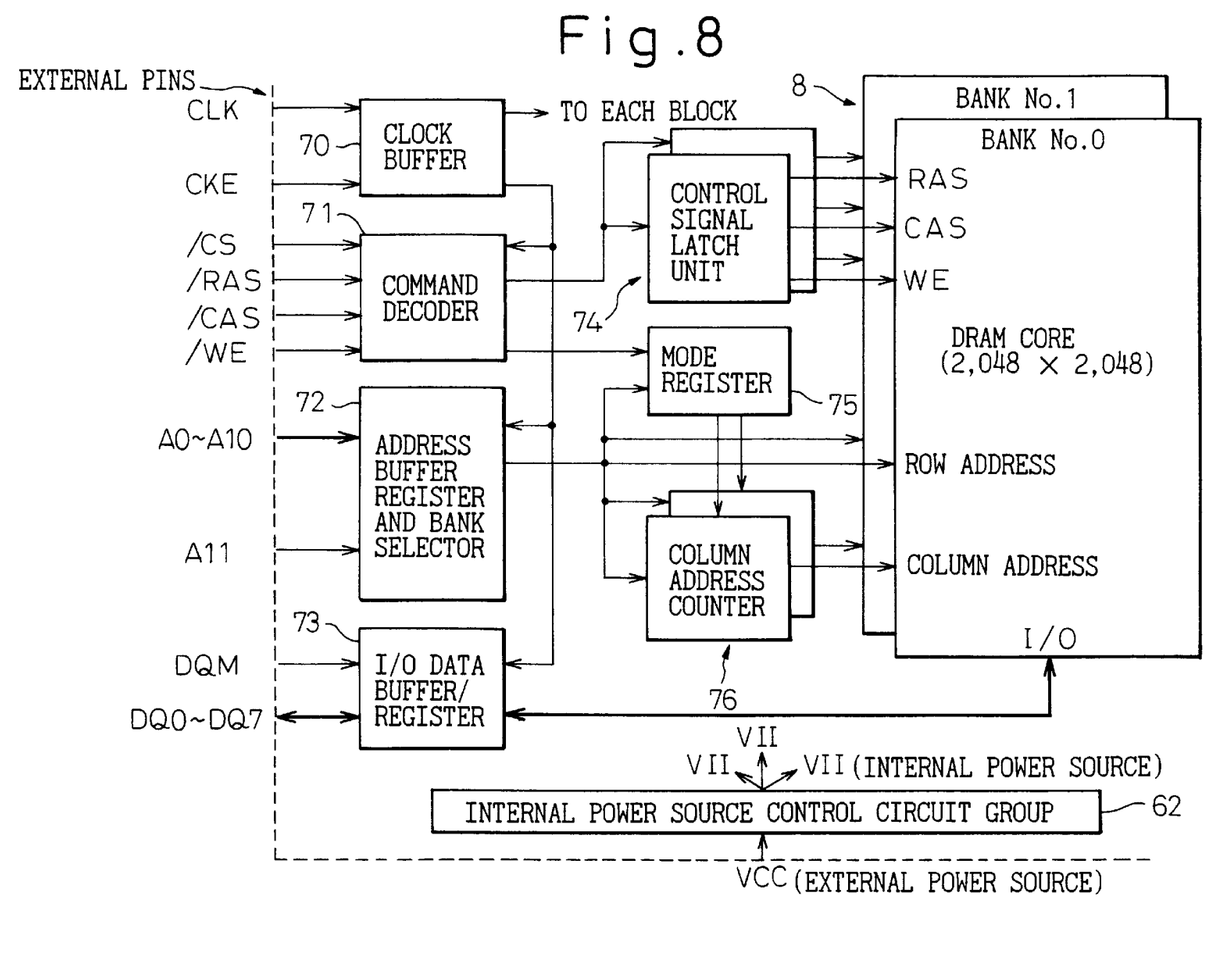
FIG. 8 is a block diagram showing a schematic construction of a DRAM to which a preferred embodiment of the present invention is applied.
Figure 9:
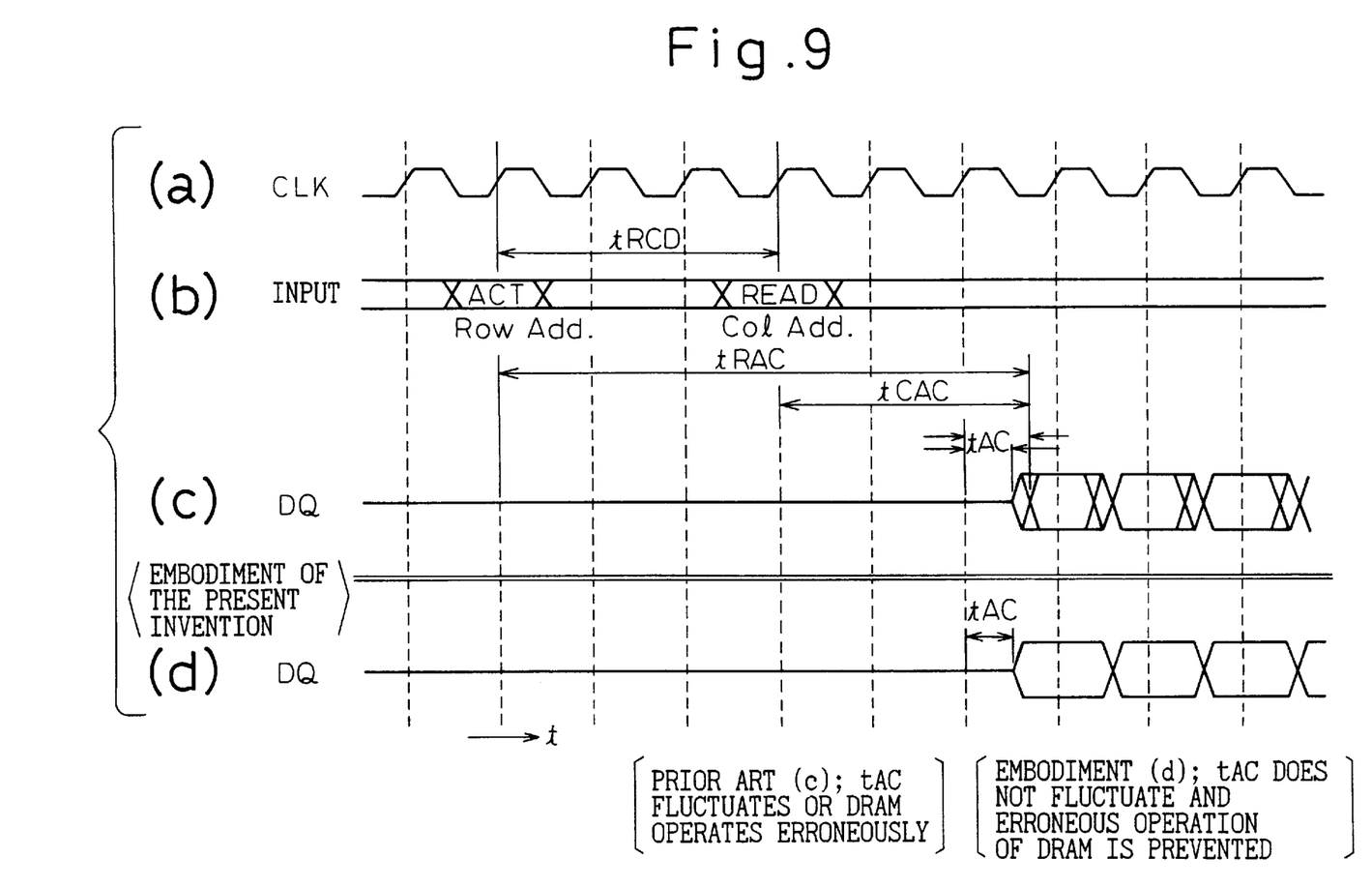
FIG. 9 is a timing chart for explaining the operation of the DRAM shown in FIG. 8.

FIG. 8 is a block diagram showing a schematic construction of a DRAM (Dynamic Random Access Memory) to which a preferred embodiment of the present invention is applied, and FIG. 9 is a timing chart for explaining the operation of the DRAM shown in FIG. 8. However, the explanation will be hereby given typically about the case in which the internal power source is supplied to each of various portions of the semiconductor chip comprising synchronous DRAMs by using the internal power source control circuit group 62 equipped with the constituent elements of the present invention.

The semiconductor chip comprising the synchronous DRAMs shown in FIG. 8 includes a 2,048 bits×2,048 bits DRAM core 8 having a plurality of banks (for example, bank No. 0 and bank No. 1) for constituting the memory areas inside the chip; a control signal latch unit 74 for latching various control signals which are to be supplied to this DRAM core 8 (such as row address control signal RAS, column address signals CAS and write enable signals WE); and a mode register 75 for stipulating an operation mode of the synchronous DRAM and a column address counter 76 for counting the column address and making access to the data.

The semiconductor chip shown in FIG. 8 further includes a clock buffer 70 for holding a clock signal CLK as the reference for operating the synchronous DRAM on the basis of the clock enable signal and supplying the same to other circuit portions; a command register 71 for decoding various command signals (chip select signal CS, row address select signal /RAS, column address select signal /CAS and write enable signal /WE) and supplying the thus decoded signals to the control signal latch unit 74 and the mode register 75; an address buffer/register and bank selector 72 for holding the memory address signals A0 to A10 inclusive of the row address and the column address and the bank address signal, and supplying them to the mode register 75, the column address counter 76 and the DRAM core 8; and an I/O data buffer/register 73 for holding various data DQ (DQ0 to DQ7 and DQM) and supplying them to an I/O portion of the DRAM core 8.

The internal power source control circuit group 62 shown in FIG. 8 includes all the fuse circuit 12 for trimming the internal power source, the decoding unit 13 for the fuse information of the internal power source, the unnecessary pattern selecting circuit portion 40, the internal power source control circuit 50, and the internal power source generating circuit 60 of the present invention, and even when a glow-back occurs after the cut-off of the fuse, the internal power source VII having a stable and guaranteed voltage level can be supplied to all the circuit portions of the synchronous DRAM without causing an abnormal operation of the semiconductor chip.

In the timing chart shown in FIG. 9, various control signals are inputted to the DRAM core in synchronism with the clock signal CLK of the (a) portion (shown in the (b) portion), and the data inside this DRAM core are read out. In this case, the row address of the memory matrix inside the DRAM core is first selected and after the passage of a predetermined delay time tRCD, the column address is selected and a data read operation is started. In this case, however, the data read operation is executed after the passage of a predetermined column address count time tCAC by using the column address counter 76 in order to read out the data without error.

Here, if a glow-back occurs after the cut-off of the fuse and the voltage level of the internal power source fluctuates greatly as in the prior art example (as shown in the (c) portion), the timing of each of the rise and fall portions of the data DQ fluctuates, so that the data access time tAC cannot be accurately defined, or an erroneous operation occurs. As a result, the stable operation of the synchronous DRAM cannot be guaranteed any longer.

In contrast, in the preferred embodiment of the present invention, the voltage level of the internal power source remains within a range of voltage levels that can be regulated by the pattern of the bit information even when a glow-back occurs after the cut-off of the fuse. Therefore, the fluctuation of the data access time tAC in the preferred embodiment is smaller than that in the prior art example, the data access time AC can be accurately defined, the erroneous operation can be prevented, and the stable operation of the synchronous DRAM can be guaranteed (shown in the (d) portion).

Figure 10:
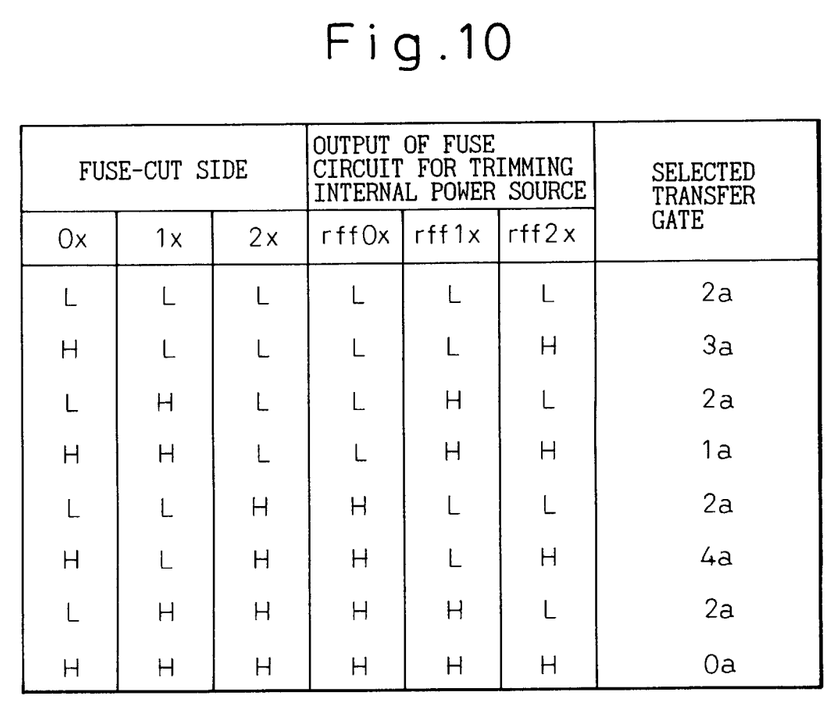
FIG. 10 is a diagram showing the relationship between a fuse selection and an output level in a preferred embodiment of the present invention.

FIG. 10 is a diagram showing the relationship between a fuse selection and an output level in the preferred embodiment of the present invention. This diagram is exemplarily given in order to clearly demonstrate the effect of the embodiments of the present invention that can never be accomplished by the prior art example shown in FIG. 4.

This diagram represents the transfer gates 0a to 4a selected by the internal power source control circuit 50, shown in FIG. 7, when the upper fuses and lower fuses of the fuse circuit 12 for trimming the internal power source, shown in FIG. 6, are selectively cut off.

In the embodiments of the present invention, the unnecessary pattern selecting circuit portion 40 (FIG. 6) is disposed inside the decoding unit 13 for fuse information of the internal power source (FIG. 6). As can be clearly understood from FIG. 10, therefore, even when an unnecessary pattern other than the patterns of the bit information used at present is selected, any one of the transfer gates of the transfer gate circuit portion 56 can be selected. Consequently, even when a glow-back occurs after the cut-off of the fuses and the spare pattern not used at present is selected, the unnecessary pattern selecting circuit portion 40 operates in such a manner that any one of the transfer gates is turned ON without fail. Therefore, a stable operating state of the overall circuit is secured, and an abnormal operation of the semiconductor ship is prevented.

Symbols 0x, 1x and 2x in FIG. 10 (or in FIG. 7) represent #x of the output signal rff#x of the fuse circuit for trimming the internal power source, and these symbols also represent the fuse information on the cut-off state of each of the fuses at all the nodes #0 to #2 on the fuse-cut side. In other words, 0x, 1x and 2x represent the levels of the three inputs in each of a plurality of NAND gates for operating any one of the transfer gates 0a to 4a of the internal power source control circuit 50.

When, for example, the first transfer gate 0a at the uppermost portion inside the internal power source control circuit 50 is desired to be selectively turned ON as shown in FIG. 10, the fuse for 0x in the NAND gate 32 for generating the fuse information pattern, which is connected to this transfer gate 0a, is cut off so that the level "H" is selected, the fuse for 1x is also cut off so that the level "H" is selected, and the fuse for 2x is also cut off so that the level "H"a is selected.

On the other hand, when the fifth transfer gate 4a of the lowermost portion is desired to be selectively turned ON, the fuse for 0x in the NAND gate 35 for generating the fuse information, which is connected to this transfer gate 4a, is cut off so that the level "H" is selected, the fuse for 1x is cut off so that the level "L" is selected and the fuse for 2x is cut off so that the level "H" is selected.

In the preferred embodiment of the present invention, further, when an unnecessary pattern other than the patterns of the bit information used at present is selected, the third transfer gate 2a disposed in the middle portion of the five transfer gates is selected and the voltage level is set to substantially the center of a range of voltage levels that can be regulated by the pattern of the bit information used at present.

As explained above, according to the embodiments of the semiconductor device of the present invention, in the first place, even when a glow-back occurs after at least a part of a plurality of fuses inside the fuse circuit is cut off and the spare pattern of the spare bit information not used at present is selected, a feedback control is executed so that any one of the transfer gates inside the internal power source control portion is turned ON without fail. Therefore, a stable operating state of the circuit can be secured and an abnormal operation of the semiconductor chip can be prevented.

According to the embodiments of the semiconductor device of the present invention, in the second place, the voltage level of the internal power source selected by the decoding unit for fuse information of the internal power source is set to substantially the center of a range of voltage levels that can be regulated by the patterns of the bit information used at present. Therefore, even when a glow-back occurs after the cut-off of the fuse and the voltage level of the internal power source fluctuates, the voltage level does not greatly deviate from the default value.

According to the embodiments of the semiconductor device of the present invention, in the third place, the voltage level of the internal power source selected by the pattern of the spare bit information is set to substantially the center of a range of voltage levels that can be regulated by the patterns of the bit information used at present. Therefore, even when a glow-back occurs after the cut-off of the fuse, the voltage level of the internal power source does not greatly deviate from the default value and the stable operation of the circuit can be secured.

According to the embodiments of the semiconductor device of the present invention, in the fourth place, the voltage level of the internal power source selected by the spare pattern is set to be substantially equal to the voltage level of the internal power source selected before the fuses are cut off. Therefore, the difference between the voltage level established before a glow-back occurs, and the voltage level brought about in the case in which a glow-back occurs after the cut-off of the fuse, becomes smaller than in the prior art. In other words, the fluctuation of the voltage level of the internal power source becomes very small, and a stable operation of the circuit even after a glow-back of the fuses can be attained.

I claim:

1. A semiconductor device having an internal power source trimming unit for regulating a voltage level of an internal power source by selecting one of m option voltages, said internal power source trimming unit including:

a fuse group for trimming said internal power source, having a plurality of fuse circuits each including a fuse capable of being cut off for outputting fuse information which is one of n information;

a decoding unit for fuse information, for decoding the fuse information and for outputting bit information which is one of m information corresponding to the m option voltages, wherein m is smaller than n; and a voltage level regulating unit for spare fuse patterns, for arranging such that the fuse information corresponding to the spare fuse patterns are allocated to any one of said option voltages.

2. A semiconductor device according to claim 1, wherein a middle value of the m option voltages is selected when any fuses in the fuse group are not cut off.

3. A semiconductor device according to claim 2, wherein the voltage level of said internal power source selected by said spare pattern is set to be substantially equal to the voltage level of said internal power source selected before a plurality of said fuses are cut off.

4. A semiconductor device according to claim 2, wherein a middle value of the m option voltages is selected when the fuse information corresponds to the spare fuse patterns.

5. A semiconductor device according to claim 2, wherein the voltage level of said internal power source selected by said spare pattern is set to be substantially equal to the voltage level of said internal power source selected before a plurality of said fuses are cut off.

6. A semiconductor device according to claim 1, wherein a middle value of the m option voltages is selected when the fuse information corresponds to the spare fuse patterns.

7. A semiconductor device according to claim 6, wherein the voltage level of said internal power source selected by said spare pattern is set to be substantially equal to the voltage level of said internal power source selected before a plurality of said fuses are cut off.

8. A semiconductor device including an internal power source trimming unit for regulating a voltage level of an internal power source, said internal power source trimming unit including:

a fuse group for trimming said internal power source, having a plurality of fuses capable of being cut off so as to regulate the voltage level of said internal power source;

a decoding unit for fuse information, for decoding fuse information in response to a cut-off state of each of a plurality of said fuses in said fuse group for trimming the internal power source, and for outputting bit information corresponding to the regulated voltage level of said internal power source; and a voltage level regulating unit for a spare fuse pattern, for receiving said fuse information and outputting bit information corresponding to one of the patterns of said bit information, when the fuse information corresponding to the spare fuse pattern and the number of said patterns of said bit information is smaller than the maximum number of patterns of said fuse information that can be generated by a plurality of said fuses.

9. A semiconductor device having an internal power source generating circuit for outputting an internal power source in response to a control voltage, comprising:

n fuse circuits each including a fuse capable of being cut off for outputting a selection signal which is n bits;

a control voltage generating circuit for outputting said reference voltage which corresponds to one of m option voltages in response to a decode signal, m being smaller than $2^n$; and a decoding circuit for decoding said selection signal for outputting said decode signal, wherein each of $2^n$ information of said selection signal corresponds to one of said m option voltages.

10. A semiconductor device according to claim 9, the decoding circuit comprising:

m-1 decode gates each receiving and decoding the selection signal for outputting the decode signal, an output from one of the m-1 decode gates corresponding to one of m-1 of the option voltages;

another decode gate receiving outputs from the m-1 decode gates;

wherein the another decode gate outputs the decode signal for selecting remaining one of the m option voltages when all the outputs from the m-1 decode gates are in inactive state.

11. A semiconductor device according to claim 9, further comprising:

a load transistor connected to an external power source for outputting the internal power source in response to the control voltage.

12. A semiconductor device according to claim 11, the control voltage generating circuit comprising:

a differential circuit comparing the control voltage and a reference voltage for controlling a potential of the control voltage;

a reference voltage generating circuit receiving the decode signal for outputting the reference voltage which corresponds to one of the m option voltages responsive to the decode signal.

13. A semiconductor device according to claim 12, the reference voltage generating circuit comprising:

a plurality of resistors connected in series and having m intermediate nodes;

a common node for providing one of the m option voltages;

m switches each disposed between the common node and corresponding one of the m intermediate nodes;

wherein one of m switches turn on responsive to the decode signal.

* * * * *